United States Patent
Lee et al.

(10) Patent No.: US 10,403,375 B2
(45) Date of Patent: Sep. 3, 2019

(54) STORAGE DEVICE AND DATA TRAINING METHOD THEREOF

(71) Applicant: Samsung Electronics Co., Ltd., Suwon-si, Gyeonggi-do (KR)

(72) Inventors: Chulseung Lee, Seoul (KR); Soon Suk Hwang, Ansan-si (KR); ChoongEui Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/953,992

(22) Filed: Apr. 16, 2018

(65) Prior Publication Data

US 2019/0080774 A1   Mar. 14, 2019

(30) Foreign Application Priority Data

Sep. 8, 2017   (KR) .................. 10-2017-0115353

(51) Int. Cl.
| | |
|---|---|
| *G11C 16/10* | (2006.01) |
| *G11C 16/32* | (2006.01) |
| *G11C 16/26* | (2006.01) |
| G11C 16/04 | (2006.01) |
| H01L 25/065 | (2006.01) |

(52) U.S. Cl.
CPC .............. *G11C 16/32* (2013.01); *G11C 16/10* (2013.01); *G11C 16/26* (2013.01); *G11C 16/0483* (2013.01); *H01L 25/0657* (2013.01); *H01L 2225/0651* (2013.01)

(58) Field of Classification Search
CPC ................................ G11C 16/10; G11C 16/26
USPC ........................................ 365/185.18, 185.24
See application file for complete search history.

(56) References Cited

U.S. PATENT DOCUMENTS

| | | | |
|---|---|---|---|
| 6,629,225 B2 | 9/2003 | Zumkehr | |
| 6,871,305 B2* | 3/2005 | Chien | G11C 16/349 |
| | | | 365/185.09 |
| 8,437,216 B2 | 5/2013 | Oh et al. | |
| 8,515,609 B2* | 8/2013 | McAndrew | G05D 1/0038 |
| | | | 244/76 R |
| 8,533,538 B2 | 9/2013 | Chaudhuri et al. | |
| 8,725,976 B2 | 5/2014 | Cho et al. | |
| 8,743,636 B2 | 6/2014 | Ware | |
| 8,868,823 B2 | 10/2014 | Harasawa et al. | |
| 9,207,949 B2* | 12/2015 | Lee | G06F 9/4401 |
| 9,432,179 B2 | 8/2016 | Stott et al. | |
| 9,502,095 B1* | 11/2016 | Kang | G11C 11/406 |
| 9,811,273 B1* | 11/2017 | Brahmadathan | G06F 3/0619 |
| 2001/0014922 A1* | 8/2001 | Kuge | G06F 13/1689 |
| | | | 710/36 |

(Continued)

*Primary Examiner* — Michael T Tran
(74) *Attorney, Agent, or Firm* — Harness, Dickey & Pierce, P.L.C.

(57) ABSTRACT

A storage device includes a plurality of nonvolatile memory devices each exchanging data by using a data strobe signal and a data signal, and a storage controller categorizing the plurality of nonvolatile memory devices into a plurality of groups and performing training in units of the plurality of groups. The storage controller performs data training on a first nonvolatile memory device selected in a first group of the plurality of groups and sets a delay of a data signal of a second nonvolatile memory device included in the first group by using a result value of the data training for the first nonvolatile memory device.

14 Claims, 11 Drawing Sheets

(56) References Cited

U.S. PATENT DOCUMENTS

| | | | | |
|---|---|---|---|---|
| 2008/0182231 A1* | 7/2008 | Cohen | G09B 7/00 | 434/350 |
| 2009/0024819 A1* | 1/2009 | Fisher | G06F 12/0897 | 711/170 |
| 2009/0327562 A1* | 12/2009 | Bellows | G06F 13/4022 | 710/305 |
| 2010/0082967 A1* | 4/2010 | Lo | G11C 5/04 | 713/2 |
| 2010/0205386 A1* | 8/2010 | Yamashita | G06F 13/1689 | 711/154 |
| 2011/0126066 A1* | 5/2011 | Jo | G06F 13/1668 | 714/746 |
| 2012/0066445 A1* | 3/2012 | Searles | G06F 1/3275 | 365/194 |
| 2012/0191964 A1* | 7/2012 | Lee | G06F 11/2284 | 713/2 |
| 2012/0284576 A1* | 11/2012 | Housty | G06F 13/1689 | 714/718 |
| 2013/0159687 A1* | 6/2013 | Cox, Jr. | G11C 7/1066 | 713/1 |
| 2014/0177947 A1* | 6/2014 | Krizhevsky | G06K 9/6255 | 382/156 |
| 2016/0180898 A1* | 6/2016 | Hwang | G11C 7/1087 | 711/103 |
| 2016/0342861 A1* | 11/2016 | Tuzel | G06K 9/6256 | |
| 2016/0357665 A1* | 12/2016 | Lee | G06F 12/0246 | |
| 2018/0293025 A1* | 10/2018 | Sakai | G06F 12/00 | |

* cited by examiner

STORAGE DEVICE AND DATA TRAINING METHOD THEREOF

CROSS-REFERENCE TO RELATED APPLICATIONS

This U.S. non-provisional application claims the benefit of priority under 35 U.S.C. § 119 to Korean Patent Application No. 10-2017-0115353, filed on Sep. 8, 2017, in the Korean Intellectual Property Office (KIPO), the entire contents of which are hereby incorporated by reference.

BACKGROUND

Various example embodiments of the inventive concepts disclosed herein relate to a semiconductor device, and more particularly, relate to a storage device for performing data training in units of group, a data training method, system, and/or non-transitory computer readable medium thereof.

There is a need and/or desire for data training (or "DQ" training) to secure the reliability of data in a storage device implemented with a plurality of nonvolatile memory devices and a storage controller. The data training includes read training and write training. The read training refers to an operation in which the storage controller aligns the center of an eye pattern of data output Dout from a nonvolatile memory device. The write training refers to an operation for aligning an eye pattern of data to be written Din (e.g., input data) in a nonvolatile memory device.

For the data training, the storage controller may write data of a specific pattern in the respective nonvolatile memory devices or may read data of a specific pattern from the nonvolatile memory devices. There is a need and/or desire for an input of a command and an address for the purpose of writing or reading pattern data in a nonvolatile memory device. Accordingly, a time taken to input a command and an address and to input or output pattern data and a time for AC timing are inevitably desired and/or required to perform the data training.

As a high-speed and high-capacity storage device is desired and/or required, a storage device that includes more nonvolatile memory devices as a storage medium and provides a speedier (e.g., faster) response characteristic is desired and/or required. In the storage device including a large number of nonvolatile memory devices, there is a need to reduce open timing for the purpose of providing speedy access performance in a situation such as power-up (e.g., device boot up sequences, etc.). There is a need for a technology for reducing the open timing, in particular, a time taken for the data training.

SUMMARY

Various example embodiments of the inventive concepts provide a storage device in which high-speed data training is possible, a data training method, a system, and/or a non-transitory computer readable medium thereof.

According to an aspect of at least one example embodiment, a storage device includes a plurality of nonvolatile memory devices each configured to exchange data based on a data strobe signal and a data signal, and a storage controller configured to categorize the plurality of nonvolatile memory devices into a plurality of groups, and perform training of the plurality of nonvolatile memory devices in units of the plurality of groups, and the storage controller is further configured to perform data training on a first nonvolatile memory device selected in a first group of the plurality of groups, and set a delay of a data signal of a second nonvolatile memory device included in the first group based on a result value of the data training for the first nonvolatile memory device.

According to another aspect of at least one example embodiment, a storage device includes a plurality of nonvolatile memory devices each configured to exchange data based on a data strobe signal and a data signal, a storage controller configured to access the plurality of nonvolatile memory devices, a plurality of buffer chips each configured to provide a data buffering function between the storage controller and the plurality of nonvolatile memory devices, and the storage controller is further configured to perform data training on the plurality of buffer chips and skip data training of the plurality of nonvolatile memory devices.

According to another aspect of at least one example embodiment, a data training method of a storage device, the storage device including a storage controller and a plurality of nonvolatile memory devices, the method includes categorizing, using the storage controller, the plurality of nonvolatile memory devices into a plurality of groups based on a categorization reference, each group of the plurality of groups including at least two nonvolatile memory devices, selecting, using the storage controller, a representative nonvolatile memory device in at least one group of the plurality of groups, performing, using the storage controller, data training with respect to the representative nonvolatile memory device, and setting, using the storage controller, delay values of data signals of the non-representative nonvolatile memory devices included in the at least one group based on a data training result for the representative nonvolatile memory device.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
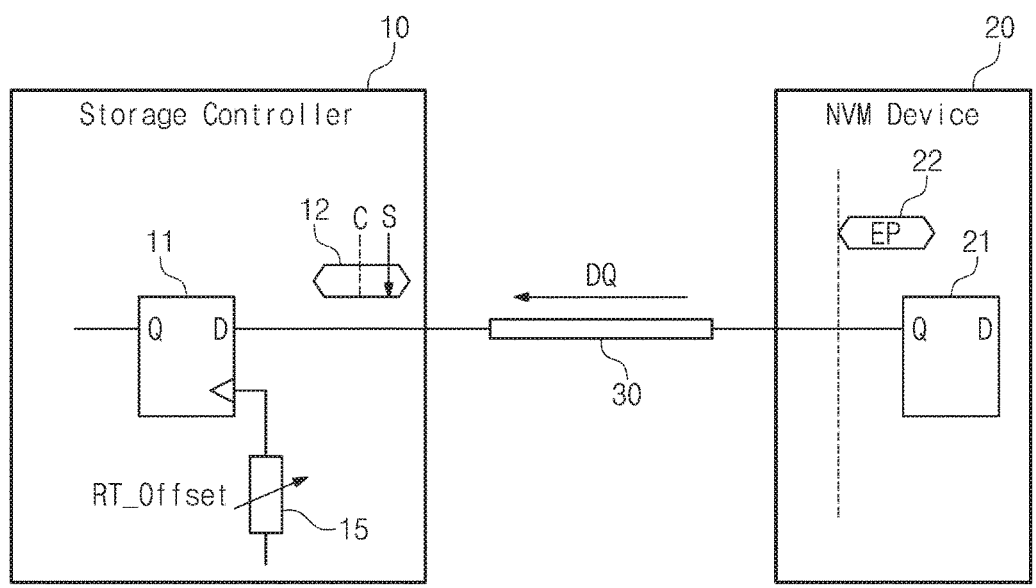
FIG. 1 is a block diagram illustrating a read training method according to at least one example embodiment of the inventive concepts.

It is to be understood that both the foregoing general description and the following detailed description are provided as examples, for illustration and not for limiting the scope of the invention. Reference numerals will be represented in detail in example embodiments of the inventive concepts, examples of which are illustrated in the accompanying drawings. Wherever possible, the same reference numerals are used in the drawings and the description to refer to the same or similar parts.

Below, a NAND-type flash memory device will be discussed as a nonvolatile memory device for describing features and functions of at least one example embodiment of the inventive concepts. However, one skilled in the art may easily understand other merits and performance of the inventive concepts depending on the contents disclosed here. For example, the features of example embodiments of the inventive concepts may be applied to a phase-change RAM (PRAM), a magnetoresistive RAM (MRAM), a resistive RAM (ReRAM), a ferroelectric RAM (FRAM), a NOR flash memory, etc., as the nonvolatile memory device. Here, the term "data training" used in this specification refers to an operation of searching for a center of an eye pattern of a data signal (DQ) and adjusting a sampling time point and/or a transmission location of the data signal (DQ) depending on the search result.

The inventive concepts may be implemented or applied through other example embodiments. In addition, the detailed description may be changed or modified according to view points and applications without departing from the claims, the scope and spirit, and any other purposes of the inventive concepts. Below, various example embodiments of the inventive concepts will be described in detail with reference to the accompanying drawings.

FIG. 1 is a block diagram illustrating a read training method according to at least one example embodiment of the inventive concepts. Referring to FIG. 1, in read training (e.g., data read training), a storage controller 10 for a storage device including at least one nonvolatile memory device (e.g., nonvolatile memory device 20) may adjust a sampling time point "S" of a data signal DQ provided from the nonvolatile memory device 20 through a data signal line 30 to the center "C" of a data signal (DQ) window. While only a single nonvolatile memory device is shown in FIG. 1, the example embodiments are not limited thereto and there may be two or more nonvolatile memory devices included in the storage device.

In the read training, the storage controller 10 may provide the nonvolatile memory device 20 with a command to request a training pattern and an address. The nonvolatile memory device 20 outputs the data signal DQ and a data strobe signal DQS in response to the toggling of a read enable signal /RE. The nonvolatile memory device 20 outputs a training pattern (e.g., the requested training pattern), which the storage controller 10 requested, by using the data signal DQ.

If the nonvolatile memory device 20 transfers the data signal DQ to the storage controller 10, a receiver latch 11 of the storage controller 10 samples the transferred data signal DQ. The nonvolatile memory device 20 may output, for example, the data signal DQ of a center-aligned eye pattern (EP) 22. However, the data signal DQ transferred to the storage controller 10 may have different delays for the respective data channels or for the respective data lines due to various factors, such as physical constraints due to the performance of the nonvolatile memory devices, data channel buses, distance between the nonvolatile memory device and the storage controller, etc. The read training is an operation for adjusting the sampling time point "S" of the eye pattern 12 of the data signal DQ provided from the nonvolatile memory device 20 to the center "C" of the eye pattern 12. That is, a sampling time point of the receiver latch 11 may be adjusted by a time $\Delta t$ through the read training.

For example, a read timing offset RT_Offset of a delay locked loop (DLL) circuit providing a clock signal to the receiver latch 11 may be adjusted through the read training. A sampling time point of the data signal DQ provided from the nonvolatile memory device 20 may be aligned to the center "C" of the eye pattern 12 through the above-described read training.

A write training operation is an operation for adjusting a write timing offset of data to be transmitted from the storage controller 10 to at least one nonvolatile memory device (e.g., nonvolatile memory device 20). The write training operation is similar to the read training operation except that the data signal DQ input to the nonvolatile memory device 20 is aligned. Accordingly, a detailed description of the write training operation will not be repeated here.

In general, the data training is performed by using the nonvolatile memory device 20 connected to the storage controller 10 as a target. However, in the case where the number of nonvolatile memory devices connected to the storage controller 10 increases, e.g., for high capacity storage devices, etc., a sharp increase in a time taken to perform the data training is inevitable. According to at least one example embodiment of the inventive concepts, there may be provided a technology for reducing a time taken for a training operation while providing a desired, improved and/or optimum training effect in a storage device including a plurality of nonvolatile memory devices.

Figure 2:
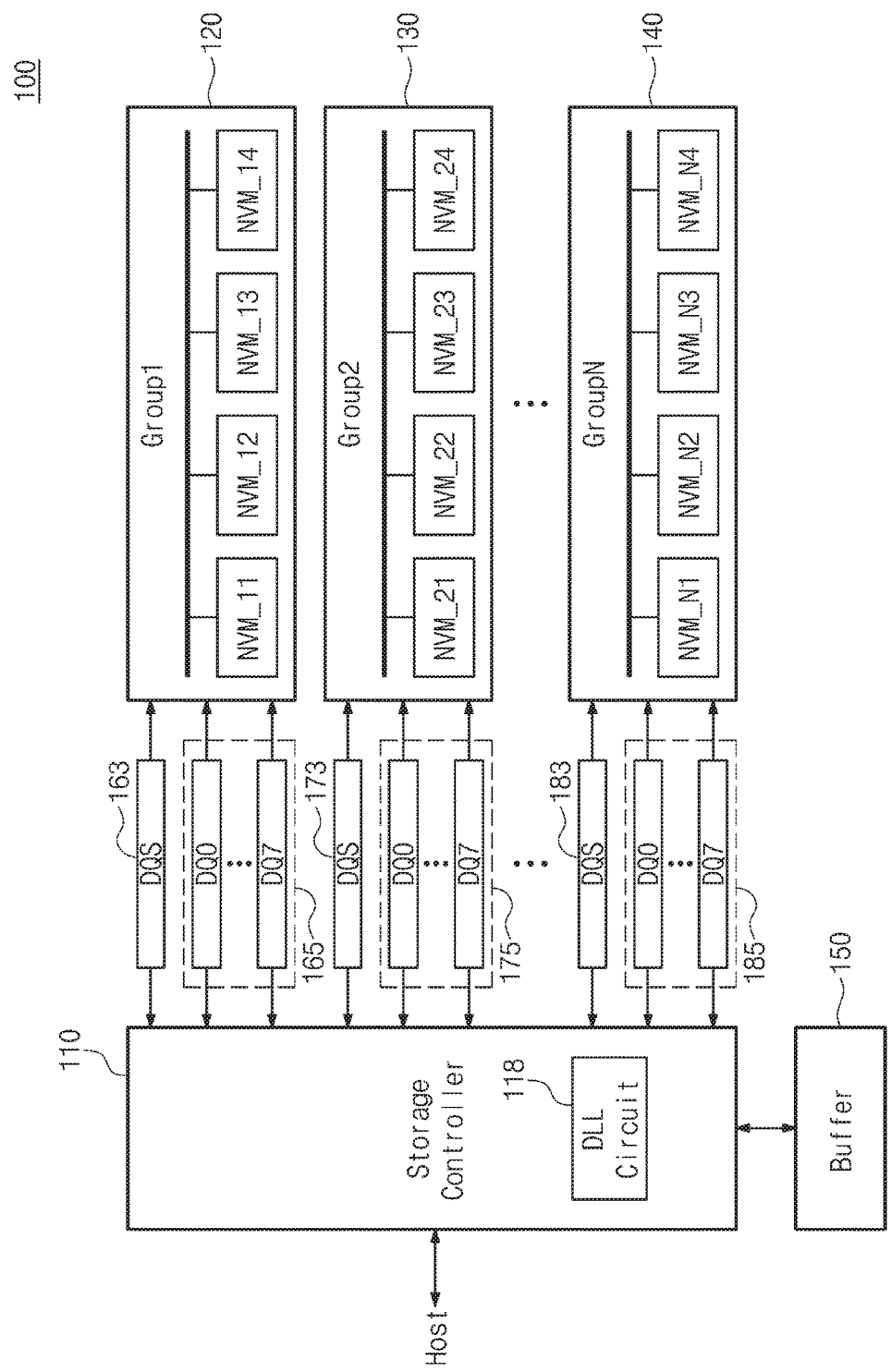
FIG. 2 is a block diagram illustrating a storage device according to at least one example embodiment of the inventive concepts.

FIG. 2 is a block diagram illustrating a storage device according to at least one example embodiment of the inventive concepts. Referring to FIG. 2, a storage device 100 includes a storage controller 110, a plurality of nonvolatile memory devices 120, 130, and 140, and/or a buffer 150, but is not limited thereto. Data strobe lines 163, 173, and 183 and data lines 165, 175, and 185 are provided to exchange data between the storage controller 110 and the plurality of nonvolatile memory devices 120, 130, and 140.

The storage controller 110 may be configured to control the plurality of nonvolatile memory devices 120, 130, and 140. For example, the storage controller 110 writes data in one or more of the plurality of nonvolatile memory devices 120, 130, and 140 depending on a request of an external source and/or a host. Also, the storage controller 110 may read data stored in one or more of the plurality of nonvolatile memory devices 120, 130, and 140 depending on a request of the external source and/or the host. The storage controller 110 may provide the nonvolatile memory devices 120, 130, and 140 with a command, an address, and a control signal for an access to the nonvolatile memory devices 120, 130, and 140. The storage controller 110 may access the plurality of nonvolatile memory devices 120, 130, and 140 for the purpose of reading and/or writing data that the host requests.

The storage controller 110 may perform data training (also referred to as "DQ training") of the nonvolatile memory devices 120, 130, and 140 in a specific situation of the storage device 100, such as booting or initialization of the storage device, a host that the storage device and/or the storage controller is connected to, etc. The storage controller 110 may improve the reliability of data exchange with the nonvolatile memory devices 120, 130, and 140 through the data training.

In particular, the storage controller 110 may perform the data training on the nonvolatile memory devices 120, 130, and 140 in units of groups. In each group, the storage controller 110 may train one nonvolatile memory device and may apply the training result to the other nonvolatile memory devices of the group. For example, the storage controller 110 performs the data training on one nonvolatile memory device NVM_11 of nonvolatile memory devices NVM11 to NVM14 of a first group Group1.

The storage controller 110 may write and/or read a training pattern in the selected nonvolatile memory device NVM_11 under various conditions to detect a center of a data signal (DQ) window (e.g., the midpoint of the DQ window). To align the detected center of the data signal window to the sampling time point of the data signal DQ, the storage controller 110 may adjust a delay offset of a delay locked loop (DLL) circuit 118 or a phase locked loop (PLL) circuit (not shown). In particular, the delay offset obtained as the training result of the nonvolatile memory device NVM_11 may also be applied to the remaining nonvolatile memory devices NVM_12, NVM_13, and NVM_14 included in the first group Group1, but the example embodiments are not limited thereto and the data training may also be performed for one or more of the remaining nonvolatile memory devices of the group. Accordingly, the data training associated with the nonvolatile memory devices NVM_12, NVM_13, and NVM_14 may be omitted.

The data training that is performed in a group unit may be equally applied to nonvolatile memory devices NVM_21 to NVM_24 belonging to a second group Group2 and nonvolatile memory devices NVM_N1 to NVM_N4 belonging to an N-th group GroupN. That is, according to the group unit data training manner, the data training may be applied to (e.g., performed on) only one nonvolatile memory device included in each group. In other words, the data training result of one nonvolatile memory device (hereinafter referred to as a "representative nonvolatile memory device") may be equally applied to (e.g., applied to each of the) other nonvolatile memory devices belonging to the same group.

Here, a reference for selecting one representative nonvolatile memory device corresponding to a data training target in each group may be provided by using information, such as an address, an electrical characteristic, a relative distance from the storage controller 110, etc., but is not limited thereto. However, the representative nonvolatile memory device may be randomly selected. In addition, characteristics of the data signals DQ of nonvolatile memory devices belonging to the same group may be considered as being the same as, or similar to, each other. A reference for categorizing groups may be provided in consideration of the characteristic.

In the case of applying the group unit data training manner of at least one example embodiment of the inventive concepts, it may be possible to markedly reduce the time necessary to perform the data training of the storage device 100 including a large number of nonvolatile memory devices. Accordingly, because the open timing (e.g., the time spent performing the data training of the storage device) is short in situations, such as booting, where the data training of the storage device 100 is typically performed, the storage device 100 of one or more of the example embodiments of the inventive concepts may be quickly accessed.

Figure 3:
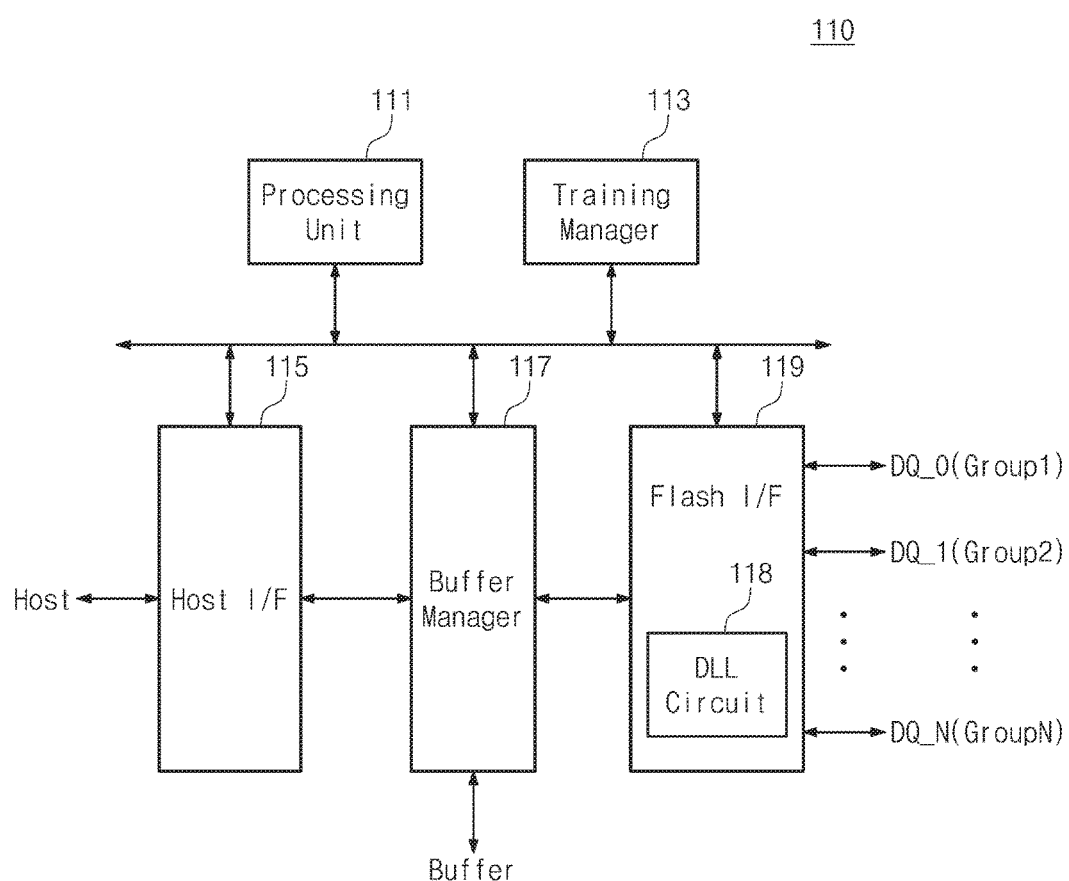
FIG. 3 is a block diagram illustrating a storage controller according to at least one example embodiment of the inventive concepts.

FIG. 3 is a block diagram illustrating a storage controller according to at least one example embodiment of the inventive concepts. Referring to FIG. 3, the storage controller 110 includes a processing unit 111, a training manager 113, a host interface 115, a buffer manager 117, and/or a flash interface 119, but is not limited thereto. However, it may be well understood by one of ordinary skill in the art that components of the storage controller 110 are not limited to the aforementioned components. For example, the storage controller 110 may further include a read only memory (ROM) storing code data necessary for an initial booting operation, a working memory, etc.

The processing unit 111 may include one or more central processing units, micro-processors, multi-core processors, multi-processor systems, distributed processors, etc. The processing unit 111 may process overall control operations that are performed in the storage controller 110. The processing unit 111 may be configured to execute special purpose firmware and/or special purpose software including computer readable instructions for operating the storage controller 110 according to at least one example embodiment of the inventive concepts.

The training manager 113 performs data training (e.g., DQ training) for communication with the nonvolatile memory device 120 in a specific situation of the storage device 100, such as booting, etc. The training manager 113 executes a plurality of detection steps to determine the position of the center of the data signal DQ. To align the determined center of the data signal to the sampling time point of the data signal DQ, the training manager 113 may adjust an offset value of a delay locked loop (DLL) and/or a phase locked loop (PLL), etc., of the storage controller 110.

In particular, the training manager 113 performs the data training on the plurality of nonvolatile memory devices 120, 130, and 140 (refer to FIG. 2) in units of group (e.g., groups of nonvolatile memory devices). In each group, the data training is performed on a representative nonvolatile memory device, and according to some example embodiments, the data training is performed only on the representative nonvolatile memory device. The training manager 113 equally applies the training result obtained through the representative nonvolatile memory device to offset settings of the remaining nonvolatile memory devices in the same group.

The training manager 113 may set the delay locked loop DLL and/or the phase locked loop PLL of the storage controller 110 with a desired, improved and/or optimum timing offset value with reference to the determined center of the data signal DQ. The training manager 113 may be implemented with hardware, but it will be well understood by one of ordinary skill in the art that the training manager 113 is provided in the form of firmware and/or software loaded on the working memory (not shown) of the storage controller 110 and/or the storage device.

The host interface 115 may provide an interface between the host and the storage controller 110. The host and the storage controller 110 may be connected through at least one of various standardized interfaces (e.g., data bus interface, etc.). As another example, the host and the storage controller 110 may be connected through at least one of the various standardized interfaces. Here, the standardized interfaces may include various interfaces manners such as advanced technology attachment (ATA), serial ATA (SATA), external SATA (e-SATA), mini SATA (mSATA), a small computer small interface (SCSI), a serial attached SCSI (SAS), peripheral component interconnection (PCI), PCI Express (PCI-E), universal serial bus (USB), IEEE 1394, universal flash store (UFS), and/or a card interface, etc., but the example embodiments are not limited thereto.

The buffer manager 117 controls the buffer 150 (refer to FIG. 2) for the purpose of temporarily storing data exchanged through the host interface 115 and the flash interface 119. Also, the buffer manager 117 may store a training pattern exchanged with the representative nonvolatile memory devices in a read training operation and/or a write training operation.

According to at least one example embodiment, the flash interface 119 provides an interface between the storage controller 110 and the nonvolatile memory device 120, but the example embodiments are not limited thereto and a different data bus interface type may be used for communication between the storage controller 110 and the nonvolatile memory device 120. For example, data processed by the processing unit 111 are transferred to the nonvolatile memory device 120 through the flash interface 119. As another example, data stored in the nonvolatile memory device 120 are read through the flash interface 119.

The flash interface 119 may categorize the nonvolatile memory devices 120, 130, and 140 in units of groups during the data training operation. The data training may be performed on a nonvolatile memory device selected from each group. A training result value obtained from a nonvolatile memory device corresponding to a data training target in each group may be applied to each of the other nonvolatile memory devices in each group.

The flash interface 119 may include a clock circuit for exchanging the data signal DQ with the nonvolatile memory device 120. For example, the flash interface 119 may include the delay locked loop circuit 118. The center of the data signal DQ transmitted from the nonvolatile memory 120 may be aligned to the sampling time point of the data signal DQ by adjusting a timing offset of the delay locked loop circuit 118 in accordance with the determined center of the DQ signal.

The components of the storage controller 110 according to at least one example embodiment are discussed above. The storage controller 110 of at least one example embodiment of the inventive concepts trains a plurality of nonvolatile memory devices in units of groups during the data training operation. According to some example embodiments, only one representative nonvolatile memory device in each group of nonvolatile memory devices is selected for data training. The data training result obtained from the representative nonvolatile memory device may be shared with the remaining nonvolatile memory devices in the group. Accordingly, it may be possible to markedly reduce the time taken to perform the data training operation.

Figure 4:
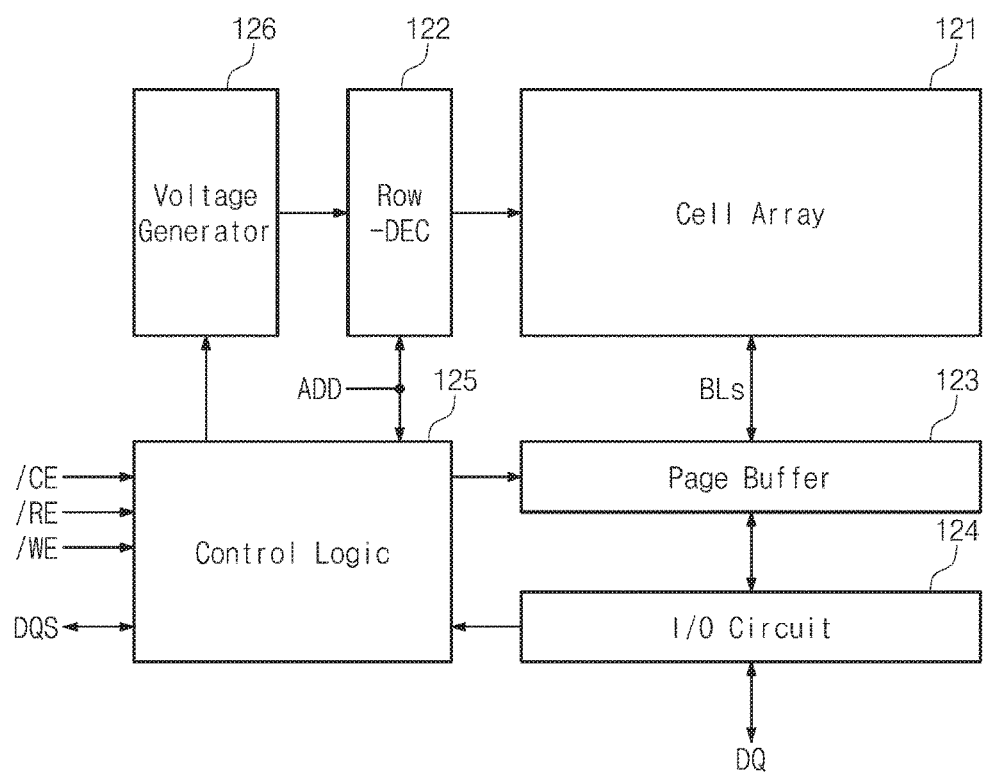
FIG. 4 is a block diagram illustrating a nonvolatile memory device of FIG. 2 according to at least one example embodiment.

FIG. 4 is a block diagram illustrating a nonvolatile memory device of FIG. 2 according to at least one example embodiment. Referring to FIG. 4, the nonvolatile memory device NVM_11 belonging to a first group Group1 may include a cell array 121, a row decoder 122, a page buffer 123, an input/output circuit 124, control logic 125, and/or a voltage generator 126, but is not limited thereto.

The cell array 121 is connected to the row decoder 122 through word lines WL and/or selection lines SSL and GSL. The cell array 121 is connected to the page buffer 123 through bit lines BLs. The cell array 121 may include a plurality of cell strings formed in a NAND type. The cell strings may constitute a memory block BLK. Here, a channel of each cell string may be formed in a vertical or a horizontal direction. The memory cells included in the cell array 121 are programmed by voltages that are provided to a word line and bit lines.

In at least one example embodiment, the cell array 121 may be implemented with a three dimensional (3D) memory array, but the example embodiments are not limited thereto. The 3-dimensional memory array may be monolithically formed in one or more physical level(s) of a memory cell array having an active area arranged on a circuit related on a silicon substrate and an operation of memory cells, but the example embodiments are not limited thereto. The circuit related to an operation of memory cells may be located in a substrate or on a substrate. The term "monolithic" means that layers of each level of the array are directly deposited on the layers of each underlying level of the array.

The row decoder 122 may select one of the memory blocks of the cell array 121 in response to an address ADD. The row decoder 122 may select one of word lines of the selected memory block. The row decoder 122 may transfer a word line voltage VWL from the voltage generator 126 to the selected word line.

The page buffer 123 may operate as a write driver in a program operation and as a sense amplifier in a read operation. In the program operation, the page buffer 123 supplies a bit line voltage corresponding to to-be-programmed data to a bit line of the cell array 121. In the read operation, the page buffer 123 may sense data stored in a selected memory cell through a bit line. The page buffer 123 latches the sensed data and outputs the latched data to the input/output circuit 124. The page buffer 123 of at least one example embodiment of the inventive concepts may be used as a first-in first-out (FIFO) buffer that stores a training pattern in a data training operation, but the example embodiments are not limited thereto, and other data structures may be used, such as last-in first-out (LIFO), etc. That is, in a write training operation, the training pattern may be output after being stored in the page buffer 123, without storing the training pattern in the cell array 121.

The input/output circuit 124 transmits write data received during the program operation to the page buffer 123. The input/output circuit 124 outputs data provided from the page buffer 123 to the outside (e.g., an external source, the host, etc.) in the read operation. The input/output circuit 124 transmits the received address ADD and/or the received command to the row decoder 122 and/or the control logic 125.

The control logic 125 controls the page buffer 123 and the voltage generator 126 in response to a command and control signals /CE, /RE, /WE, and DQS transmitted from the outside (e.g., an external source, the host, etc.). The control logic 125 latches write data in response to the data strobe signal DQS provided by the storage controller 110 in a write operation. In contrast, in a read operation, the control logic 125 generates the data strobe signal DQS by using a read enable signal /RE provided by the storage controller 110.

The voltage generator 126 may generate various word line voltages VWL to be supplied to word lines and a voltage to be supplied to a bulk (e.g., a well area) in which memory cells are formed, under control of the control logic 125. The word line voltages to be supplied to the word lines include a program voltage Vpgm, a pass voltage Vpass, selection and/or non-selection read voltages Vrd and Vread, etc.

Figure 5:
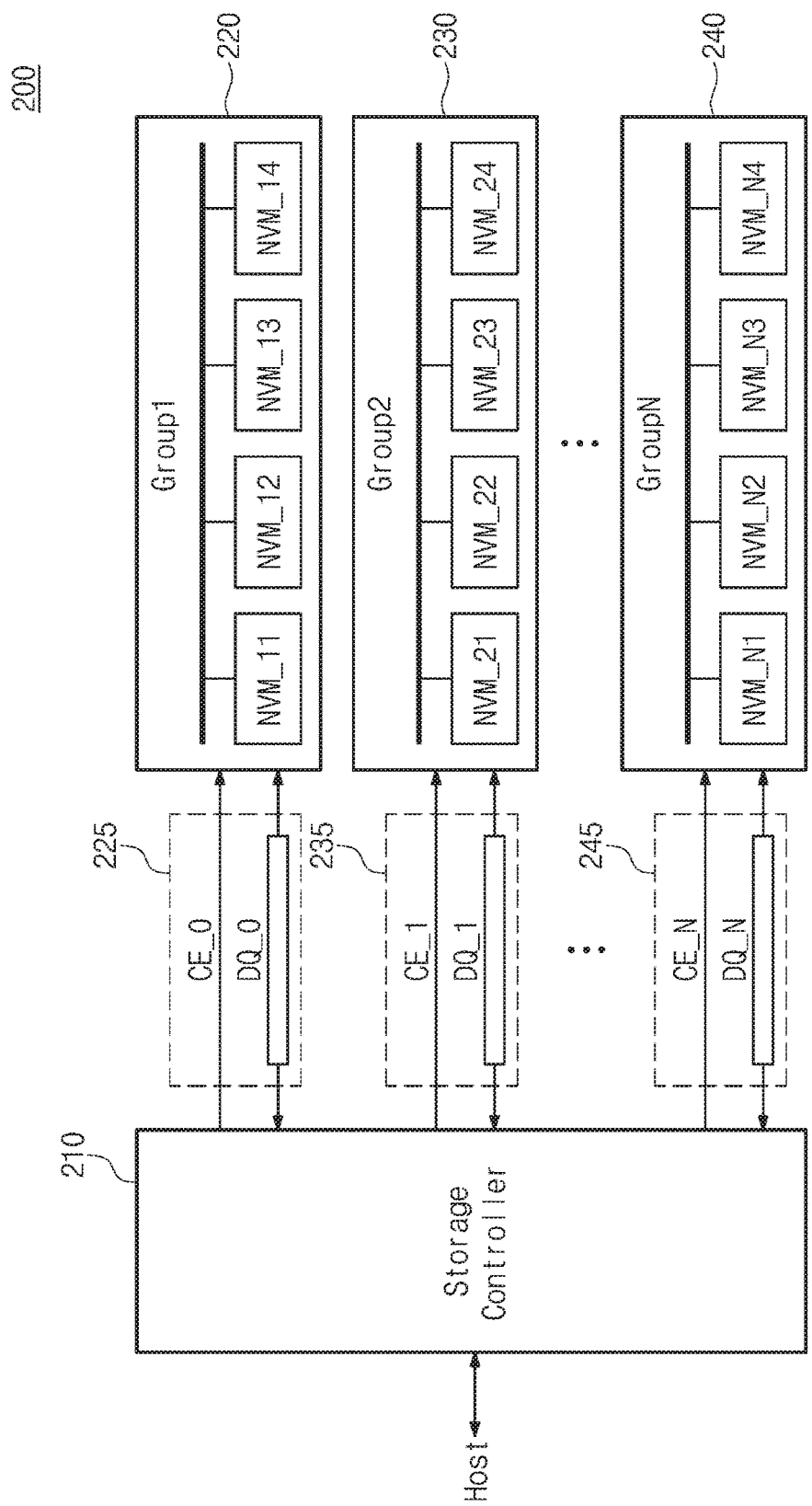
FIG. 5 is a block diagram illustrating one example of a method for grouping nonvolatile memory devices, according to at least one example embodiment of the inventive concepts.

FIG. 5 is a block diagram illustrating one example of a method for grouping nonvolatile memory devices, according to at least one example embodiment of the inventive concepts. Referring to FIG. 5, a storage device 200 may include a plurality of nonvolatile memory devices 220, 230, and 240 grouped on the basis of the chip enable signal CE, but is not limited thereto. That is, data training of the storage device 200 may target any one of the nonvolatile memory devices sharing the chip enable signal CE. Below, illustration and description of the data strobe signal DQS transmitted in units of groups of nonvolatile memory devices may be omitted for convenience of description.

A storage controller 210 may select one or more of the nonvolatile memory devices 220 among a plurality of nonvolatile memory devices through a chip enable signal CE_0. The storage controller 210 may select one or more of the nonvolatile memory devices 230 among the plurality of nonvolatile memory devices through a chip enable signal CE_1. The storage controller 210 may select one or more of the nonvolatile memory devices 240 among the plurality of nonvolatile memory devices through a chip enable signal CE_N.

The chip enable signals CE_0, CE_1, . . . , CE_N may be assigned in units of chips (e.g., memory chips, nonvolatile memory devices, etc.) having the same data skew DQ Skew upon designing the storage device 200. That is, the storage device 200 is designed such that chips which have the same data skew DQ Skew or have data skews which are different from each other but not are similar enough to not have a significant influence on data transmission (e.g., the memory chips of each unit have the same, a substantially similar and/or negligible data skews, etc.), are selected by one chip enable signal CE. For example, the nonvolatile memory devices NVM_11, NVM_12, NVM_13, and NVM_14 connected to data and a signal line 225, which have the same or similar delays or data skew characteristics, may be selected as the first group Group1 for data training. That is, the nonvolatile memory devices NVM_11, NVM_12, NVM_13, and NVM_14 (e.g., the chips) sharing the chip enable signal CE_0 may be categorized as the first group Group1 for data training.

The nonvolatile memory devices NVM_21, NVM_22, NVM_23, and NVM_24 (e.g., the chips) sharing the chip enable signal CE_1 may be categorized as the second group Group2 for the data training of the group unit. The nonvolatile memory devices NVM_N1, NVM_N2, NVM_N3, and NVM_N4 sharing the chip enable signal CE_N may be categorized as the N-th group GroupN. In the data training, only representative chips (and/or nonvolatile memory devices) of the groups Group1, Group2, . . . , GroupN are targeted for training, but the example embodiments are not limited thereto. A data training result of the representative chips may be applied to an offset setting value of a delay locked loop to define sampling of the data signal DQ of the other chips in the respective groups corresponding to each representative chip or a point in time to transmit the data signal DQ. Accordingly, in the case where nonvolatile memory devices are categorized into 8 groups and 4 chips are present in each group, 32 chips are targeted for training when data training is performed with respect to all chips. However, according to at least one example embodiment of the inventive concepts, if data training is performed in a group unit, the data training may be performed with respect to only 8 representative chips among 32 chips, thereby speeding up the data training operation, decreasing the power consumption and resource consumption of the data training operation, and increasing the overall efficiency of the storage device.

For example, a representative nonvolatile memory device (e.g., NVM_11) corresponding to a data training target is selected from the nonvolatile memory devices NVM_11, NVM_12, NVM_13, and NVM_14 of the first group Group1. The data training is performed with respect to the representative nonvolatile memory device NVM_11. The result of performing the data training of the representative nonvolatile memory device NVM_11 may be equally applied to the remaining nonvolatile memory devices NVM_12, NVM_13, and NVM_14 of the first group Group1. The training method may also be applied to the remaining groups Group2, . . . , GroupN.

A group categorization method for performing data training in units of chip enable signal CE is briefly described above. In other words, if the chip enable signal CE_0 is activated, all of the nonvolatile memory devices 220 of the first group Group1 are selected. The storage controller 210 may provide a chip address for the purpose of selecting any one of the nonvolatile memory devices 220 selected using the chip enable signal CE_0.

If the chip enable signal CE is allocated on the basis of the data skew DQ Skew upon design, grouping for the data training may be efficiently performed. Also, it may be possible to markedly reduce a time taken for data training of the storage device 200 through performing the data training of the group unit (also referred to as a "group-based data training operation").

Figure 6:
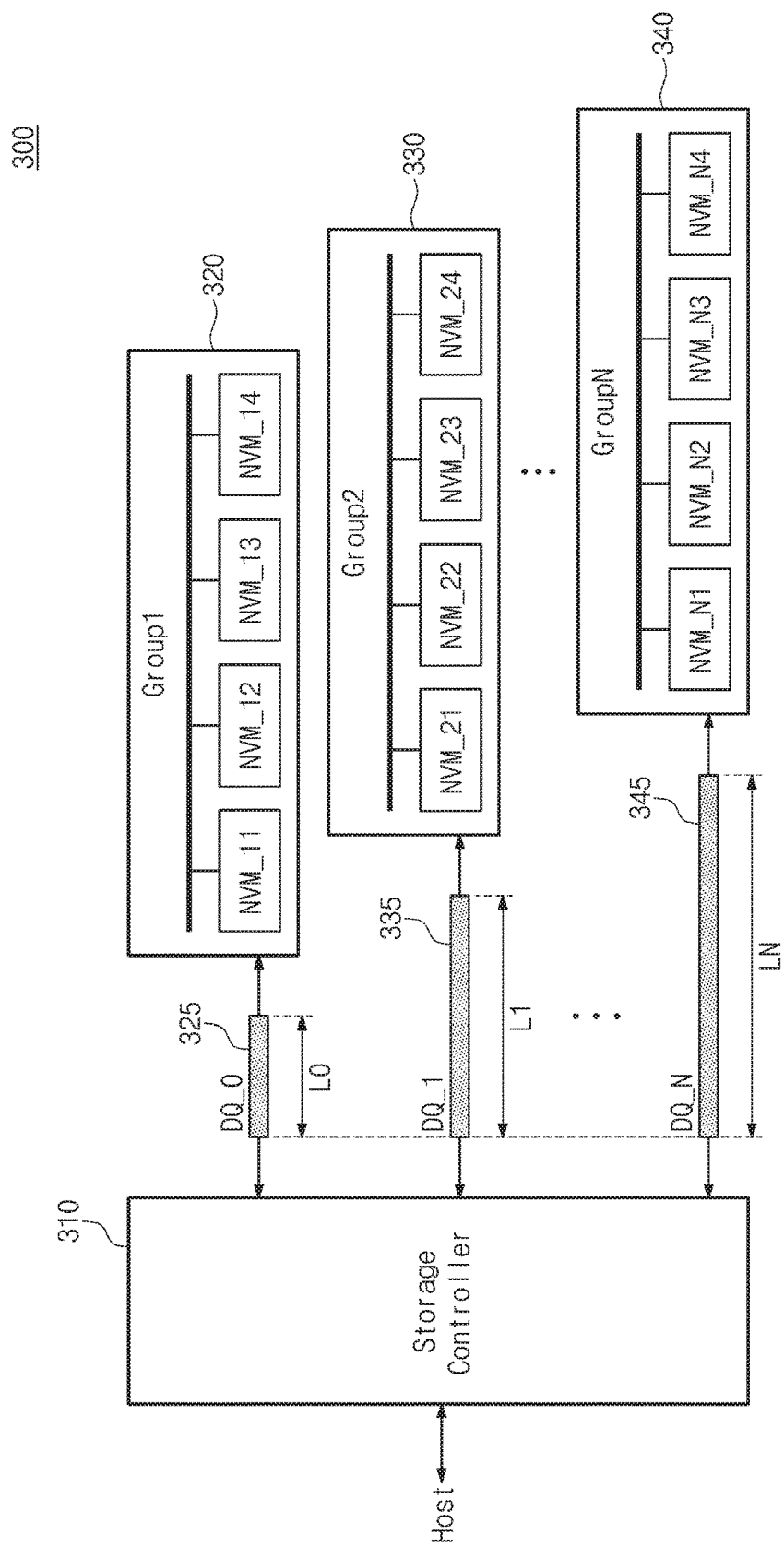
FIG. 6 is a block diagram illustrating a method for grouping nonvolatile memory devices, according to at least one example embodiment of the inventive concepts.

FIG. 6 is a block diagram illustrating a method for grouping nonvolatile memory devices, according to at least one example embodiment of the inventive concepts. Referring to FIG. 6, a storage device 300 includes a plurality of nonvolatile memory devices 320, 330, and 340 categorized into a plurality of groups Group1, Group2, . . . , GroupN, but the example embodiments are not limited thereto. Here, the categorization of the plurality of groups Group1, Group2, . . . , GroupN may be made according to the relative distances of the nonvolatile memory devices from a storage controller 310. Data training may be performed with respect to one nonvolatile memory device included in each of the groups Group1, Group2, . . . , GroupN.

The storage controller 310 may perform data training for the purpose of securing the reliability of data exchanges with the nonvolatile memory devices 320, 330, and 340, etc., for example in booting, initialization, specific data transmission situations of the storage device 300, etc. In particular, the storage controller 310 may perform data training in units of groups Group1, Group2, . . . , GroupN.

For example, the storage controller 310 performs the data training with respect to any one of nonvolatile memory devices NVM_11, NVM_12, NVM_13, and NVM_14 of a first group (Group1) 320. The storage controller 310 performs the data training with respect to any one of nonvolatile memory devices NVM_21, NVM_22, NVM_23, and NVM_24 of a second group (Group2) 330. Likewise, the storage controller 310 performs the data training with respect to any one of nonvolatile memory devices NVM_N1, NVM_N2, NVM_N3, and NVM_N4 of an N-th group (GroupN) 340. Afterwards, the storage controller 310 may use the execution result of the data training of the representative nonvolatile memory device of each of the groups Group1, Group2, . . . , GroupN for alignment of a data signal of the remaining nonvolatile memory devices in each group.

Here, a reference for categorization of the groups 320, 330, and 340 may be determined based on a length of a data signal line DQ Line of each of the nonvolatile memory devices NVM_ij (i and j being a natural number). In detail, groups may be determined according to the relative lengths of data signal lines DQ Line formed between the nonvolatile memory devices NVM_ij and the storage controller 310, but the example embodiments are not limited thereto and other factors and/or characteristics may be used to determine the nonvolatile memory device groups.

For example, nonvolatile memory devices NVM_11, NVM_12, NVM_13, and NVM_14 of the first group 320 may be chips (e.g., nonvolatile memory devices, flash memory devices, etc.) in which a length of a data line (DQ_0) 325 connected with the storage controller 310 is not more than "L0". Nonvolatile memory devices NVM_21, NVM_22, NVM_23, and NVM_24 of the second group 330 may be chips in which a length of a data line (DQ_1) 335 connected with the storage controller 310 is longer than "L0" and is not more than "L1". Nonvolatile memory devices NVM_N1, NVM_N2, NVM_N3, and NVM_N4 of the N-th group 340 may be chips in which a length of a data line (DQ_N) 345 connected with the storage controller 310 is not less than "LN".

A length of a data line is included as the most critical factor to have an influence on a delay of the data signal DQ. Accordingly, it may be possible to group the nonvolatile memory devices NVM_ij for data training on the basis of a length of the data line DQ. If the categorization of groups is completed, data training may be performed with respect to any one chip (or nonvolatile memory device) in a group. The reliability of data may be maintained even though the result of the data training associated with the any one chip is applied to the remaining chips in a group including the any one chip. That is, the data training result of the representative chip of each group may be applied to an offset setting value of a delay locked loop to define sampling of the data signal DQ of the other chips in a group corresponding to each representative chip and/or a point in time to transmit the data signal DQ.

A method for grouping nonvolatile memory devices for data training on the basis of a length of the data signal line DQ Line is briefly described above. It may be possible to markedly reduce a time taken for data training of the storage device 300 through performing the data training of the group unit (and/or the group-based data training operation).

Figure 7:
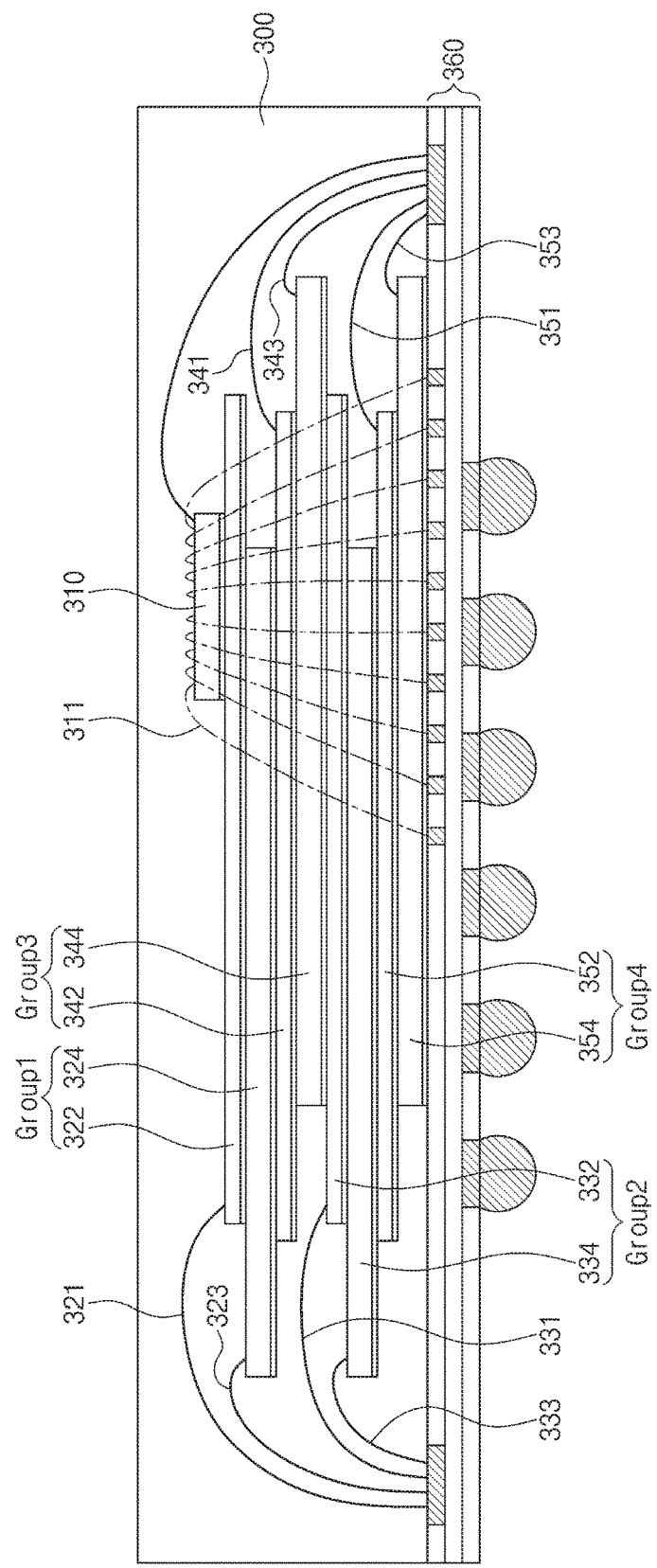
FIG. 7 is a sectional view illustrating an example of the storage device performing grouping depending on lengths of data signal lines according to at least one example embodiment.

FIG. 7 is a sectional view illustrating an example of a storage device performing grouping depending on lengths of data signal lines according to at least one example embodiment. Referring to FIG. 7, the storage device 300 may include a plurality of nonvolatile memory devices 322, 324, 332, 334, 342, 344, 352, and 354 and the storage controller 310, which are stacked on a PCB substrate 360, but the example embodiments are not limited thereto.

The storage controller 310 may be mounted on the uppermost one of a plurality of stacked nonvolatile memory devices 322, 324, 332, 334, 342, 344, 352, and 354. The storage controller 310 may be connected to the PCB substrate 360 through wires 311.

For example, the nonvolatile memory devices 322 and 324 may be sequentially located under/below the storage controller 310 and may be electrically connected with the PCB substrate 360 through wires 321 and 323. The nonvolatile memory devices 342 and 344 may be sequentially located under/below the nonvolatile memory device 324 and may be electrically connected with the PCB substrate 360 through wires 341 and 343. The nonvolatile memory devices 332 and 334 may be sequentially located under/below the nonvolatile memory device 344 and may be electrically connected with the PCB substrate 360 through wires 331 and 333. The nonvolatile memory devices 352 and 354 may be sequentially located under/below the nonvolatile memory device 334 and may be electrically connected with the PCB substrate 360 through wires 351 and 353.

For example, the nonvolatile memory devices 322 and 324 may be categorized as a first group Group1 for data training. A relative length of a data signal line DQ Line between the nonvolatile memory device 322 and the storage controller 310 is determined by the wire 321 and a printed circuit formed in the PCB substrate 360. A relative length of a data signal line DQ Line between the nonvolatile memory device 324 and the storage controller 310 is determined by the wire 323 and a printed circuit formed in the PCB substrate 360. Considering a stacked location, the nonvolatile memory devices 322 and 324 may be regarded as being connected with the storage controller 310 with data signal lines DQ Line of the same, similar, and/or almost similar lengths. Accordingly, the nonvolatile memory devices 322 and 324 may be categorized as a first group Group1. In other words, when the lengths of the data signal lines are within a desired threshold length, the nonvolatile memory devices and/or memory chips may be categorized in the same group. The desired threshold length may be determined based on performance considerations of the data signal lines, such as the latency of data signal transmissions to/from the nonvolatile memory device and/or memory chip, and whether the differences between the lengths of wire are within desired performance constraints (e.g., have a negligible performance impact).

The nonvolatile memory devices 332 and 334 may be categorized as a second group Group2 for data training. A relative length of a data signal line DQ Line between the nonvolatile memory device 332 and the storage controller 310 is determined by the wire 331 and a printed circuit formed in the PCB substrate 360. A relative length of a data signal line DQ Line between the nonvolatile memory device 334 and the storage controller 310 is determined by the wire 333 and a printed circuit formed in the PCB substrate 360. The nonvolatile memory devices 332 and 334 may be regarded as being connected with the storage controller 310 with data signal lines DQ Line of the same, similar, and/or almost similar lengths. Accordingly, the nonvolatile memory devices 332 and 334 may be categorized as a second group Group2.

According to the above-described manner, the nonvolatile memory devices 342 and 344 may be categorized as a third group Group3, and the nonvolatile memory devices 352 and 354 may be categorized as a fourth group Group4. According to at least one example embodiment, the nonvolatile memory devices are electrically connected with the PCB substrate 360 using wires. However, the example embodiments of the inventive concepts are not limited thereto. For example, it may be understood that grouping of the same categorization manner is applied to a storage controller and/or nonvolatile memory devices using a through silicon via TSV, etc.

The storage controller 310 may perform data training with respect to one or more nonvolatile memory devices of the plurality of nonvolatile memory devices included in each group. The storage controller 310 may apply the result of the data training for the one nonvolatile memory device in each group to the remaining nonvolatile memory devices in each group. That is, the storage controller 310 may perform data training with respect to a representative nonvolatile memory device for each group. The storage controller 310 may apply the result of the data training of the representative nonvolatile memory device for each group to the remaining nonvolatile memory devices in each group. That is, an offset setting value of a delay locked loop DLL determined from the result of data training of one nonvolatile memory device in each group may be equally applied to the remaining nonvolatile memory devices in each group.

A method for grouping nonvolatile memory devices for data training depending on stacked locations of the nonvolatile memory devices is briefly described above. Here, the storage device 300 may be implemented with, for example, an embedded multi-media card (eMMC), but the example embodiments are not limited thereto. It may be possible to markedly reduce a time taken for data training of the storage device 300 by performing the data training of the group unit.

Figure 8:
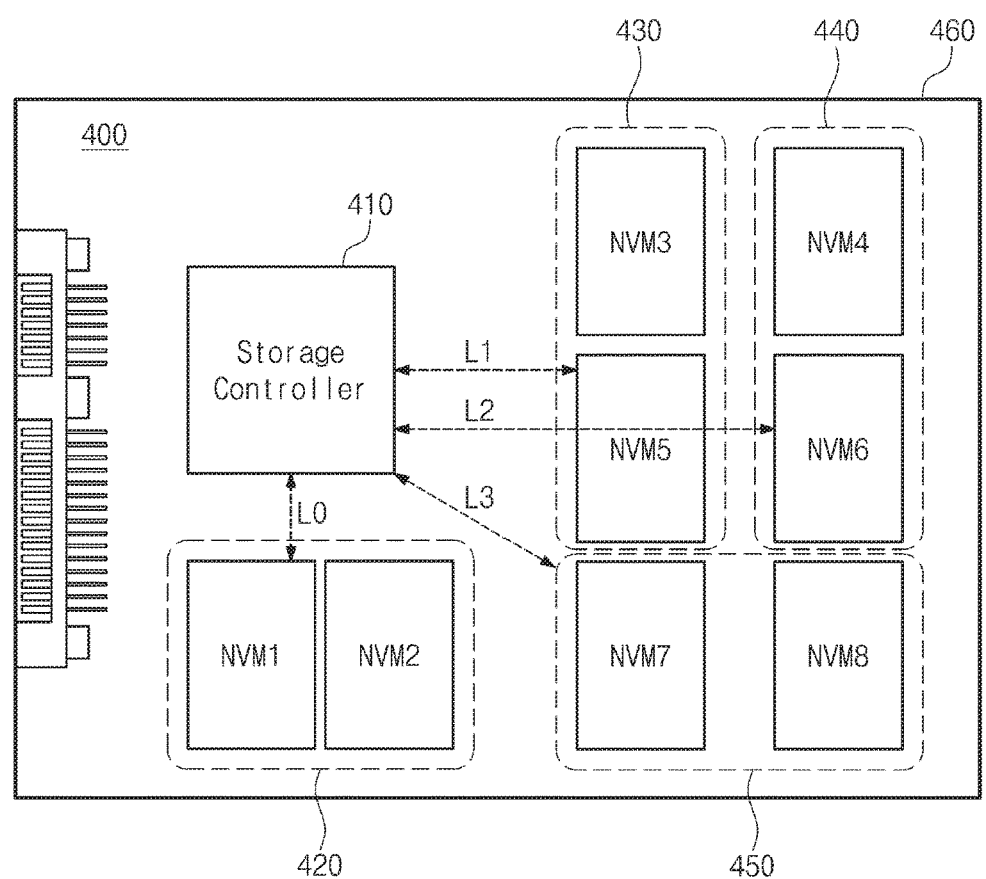
FIG. 8 is a block diagram illustrating an example of the storage device to which grouping based on electrical characteristics of data signal lines is applied according to at least one example embodiment.

FIG. 8 is a block diagram illustrating an example of a storage device to which grouping based on electrical characteristics of data signal lines is applied. Referring to FIG. 8, a storage device 400 may include a plurality of nonvolatile memory devices NVM1 to NVM8 and a storage controller 410, which are stacked on a PCB substrate 460, but are not limited thereto. Here, the plurality of nonvolatile memory devices NVM1 to NVM8 may be grouped according to electrical characteristics of signal lines formed in the PCB substrate 460, but the example embodiments are not limited thereto.

The storage controller 410 may write or read data in or from the plurality of nonvolatile memory devices NVM1 to NVM8 mounted on the PCB substrate 460. The storage controller 410 may perform data training for the purpose of securing the reliability of data exchange with the plurality of nonvolatile memory devices NVM1 to NVM8 in booting of the storage device 400, but is not limited thereto. The storage controller 410 may perform data training in units of groups 420, 430, 440, and/or 450, etc.

For example, the storage controller 410 performs data training with respect to any one of the nonvolatile memory devices NVM1 and NVM2 of a first group 420. The storage controller 410 performs data training with respect to any one of the nonvolatile memory devices NVM3 and NVM5 of a second group 430. Likewise, the storage controller 410 performs data training with respect to any one of the nonvolatile memory devices NVM4 and NVM6 of a third group 440. The storage controller 410 performs data training with respect to any one of the nonvolatile memory devices NVM7 and NVM8 of a fourth group 450. Afterwards, the storage controller 410 may apply the execution result of the data training of the representative nonvolatile memory device to each of the respective groups 420, 430, 440, and 450 to align the data signal of the remaining nonvolatile memory devices in each group.

Here, a reference for group categorization may comply with physical characteristics of a data signal line DQ Line formed between each of the nonvolatile memory devices NVM1 to NVM8 and the storage controller 410. For example, the nonvolatile memory devices NVM1 to NVM8 may be grouped according to relative distances L0, L1, L2, and L3 from the storage controller 410. However, an actual length of a data signal line DQ Line formed in the PCB substrate 460 may be determined in consideration of various detour paths. Accordingly, for example, it may be understood that the nonvolatile memory devices NVM1 to NVM8 are grouped according to lengths of printed circuits formed on the PCB substrate 460, not the relative distances L0, L1, L2, and L3.

Figure 9:
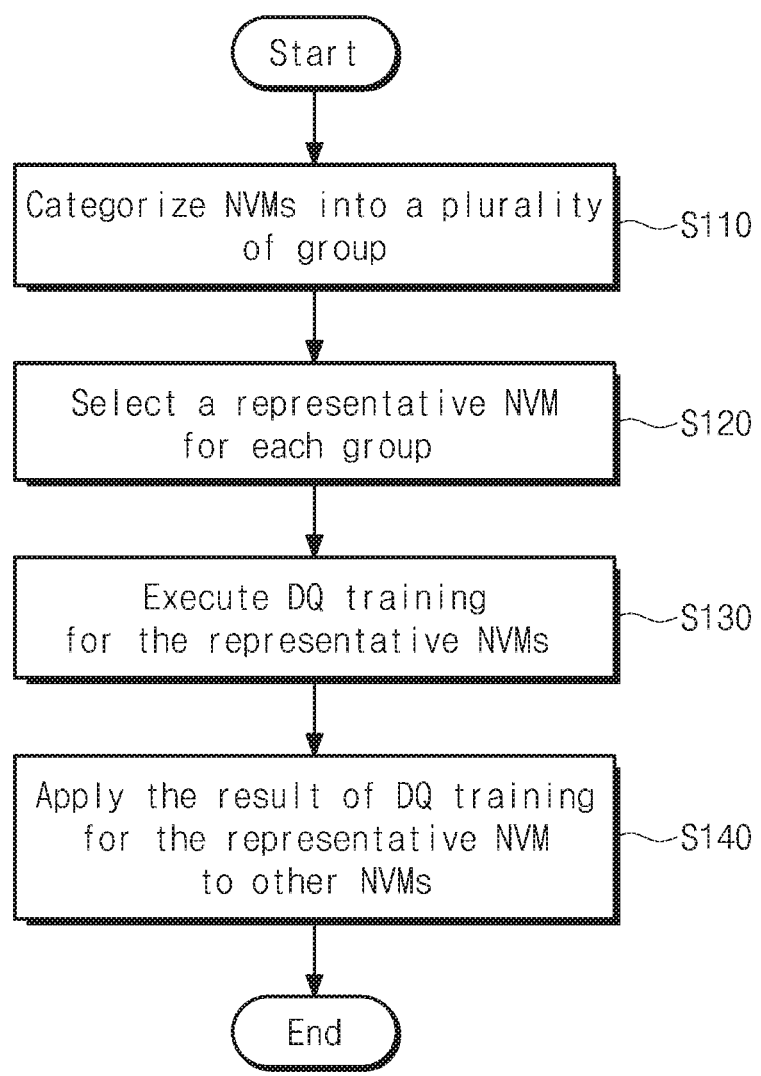
FIG. 9 is a flowchart illustrating a data training method of the storage device according to at least one example embodiment of the inventive concepts.

FIG. 9 is a flowchart illustrating a data training method of a storage device according to at least one example embodiment of the inventive concepts. Referring to FIG. 9, a storage device 100, 200, 300, or 400 of the at least one example embodiment may train a plurality of nonvolatile memory devices in units of group. Here, for the sake of convenience of description, a data training method will be described with reference to the storage device 100 of FIG. 2, however, the example embodiments are not limited thereto.

In operation S110, the storage controller 110 may categorize a plurality of nonvolatile memory devices NVM_ij depending on and/or based on a specific categorization reference. For example, the plurality of nonvolatile memory devices NVM_ij may be categorized into different groups depending on lengths and/or delay characteristics of data signal lines DQ Line, electrical characteristics, and/or allocation of the chip enable signal CE, etc.

In operation S120, the storage controller 110 selects a representative nonvolatile memory device for each of the categorized groups. The representative nonvolatile memory device may be provided as a target of data training among nonvolatile memory devices in a group. A reference for selecting the representative nonvolatile memory device may be selected on the basis of a chip address or randomly.

In operation S130, the storage controller 110 performs data training with respect to the representative nonvolatile memory device of each group. In substance, read training or write training may be performed on only the representative nonvolatile memory device, but the example embodiments are not limited thereto and may be performed on, for example, a second or more nonvolatile memory device for verification purposes or the like. Data training for nonvolatile memory devices, not the representative nonvolatile memory device in each group, may be not performed. If the data training for the representative nonvolatile memory devices is completed, the training result values of the representative nonvolatile memory devices may be obtained.

In operation S140, the storage controller 110 applies the training result value of the representative nonvolatile memory device of each group to the remaining nonvolatile memory devices in each group. That is, in each group, a sampling point, such as a point in time (e.g., a master clock signal transition, etc.) to transmit of data signals of nonvolatile memory devices not experiencing the data training may be determined by using the training result obtained from the representative nonvolatile memory device.

Accordingly, it may be possible to increase a speed to train (e.g., the training speed) the storage device 100 including a plurality of nonvolatile memory devices through the group-based data training method.

Figure 10:
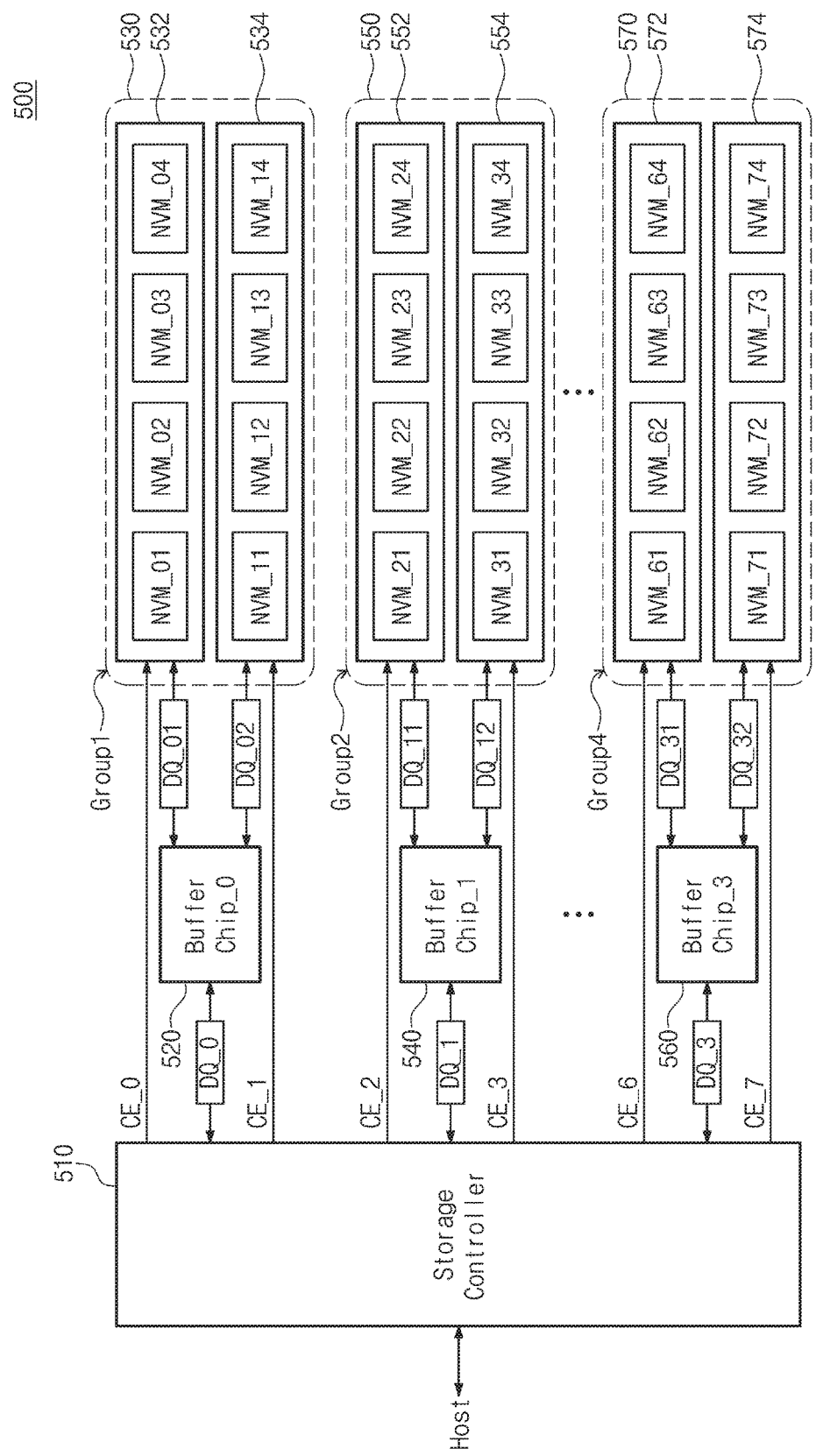
FIG. 10 is a block diagram illustrating a method for grouping nonvolatile memory devices, according to at least one example embodiment of the inventive concepts.

FIG. 10 is a block diagram illustrating a method for grouping nonvolatile memory devices, according to at least one example embodiment of the inventive concepts. Referring to FIG. 10, a storage device 500 includes a plurality of nonvolatile memory devices NVM_ij (i and j being a natural number) categorized into a plurality of groups Group1, Group2, . . . , GroupN, but is not limited thereto. The storage device 500 includes buffer chips 520, 540, and 560 for compensating for data skews DQ Skew and/or delay differences of the nonvolatile memory devices NVM_ij sharing a data signal line DQ Line. A storage controller 510 may group the nonvolatile memory devices NVM_ij on the basis of the buffer chips 520, 540, and 560.

The storage controller 510 may perform data training in units of buffer chips 520, 540, and/or 560, etc. The storage controller 410 and the buffer chip 520 may be connected through a data signal line DQ_0. The buffer chip 520 is connected with nonvolatile memory devices of a first group 530 through data signal lines DQ_01 and DQ_02. The first group 530 includes one or more sub groups, such as a first sub group 532 and/or a second sub group 534, etc., but is not limited thereto.

For example, the buffer chip 520 is connected with the first sub group 532 selected by a chip enable signal CE_0 through the data signal line DQ_01. Also, the buffer chip 520 is connected with the second sub group 534 selected by a chip enable signal CE_1 through the data signal line DQ_02. The buffer chip 520 is interposed between the storage controller 510 and nonvolatile memory devices of the one or more subgroups, e.g., the first and second sub groups 532 and 534, for the purpose of solving a data skew issue that is difficult to compensate for the data skew by using only one data signal line DQ_0. An issue due to a skew and/or a delay difference occurring in (and/or between) the nonvolatile memory devices of the first group 530 may be solved by the buffer chip 520.

Nonvolatile memory devices (e.g., memory chips, etc.), such as NVM01, NVM_02, NVM_03, and NVM_04, etc., included in the first sub group 532 are selected by the chip enable signal CE_0. In addition, nonvolatile memory devices, e.g., NVM11, NVM_12, NVM_13, and NVM_14, etc., included in the second sub group 534 are selected by the chip enable signal CE_1. Even though the different chip enable signals CE_0 and CE_1 are allocated to the first and second sub groups 532 and 534, nonvolatile memory devices included in the first and second sub groups 532 and 534 may be categorized as one group. The reason is that the first and second sub groups 532 and 534 as storage media are connected with the buffer chip 520.

Nonvolatile memory devices included in a second group 550 may be categorized into one or more sub groups, such as a third sub group 552 and/or a fourth sub group 554, etc. Nonvolatile memory devices, such as NVM21, NVM_22, NVM_23, and NVM_24, etc., included in the third sub group 552 are selected by the chip enable signal CE_2. In addition, nonvolatile memory devices, such as NVM31, NVM_32, NVM_33, and NVM_34, etc., included in the fourth sub group 554 are selected by the chip enable signal CE_3. Even though the different chip enable signals CE_2 and CE_3 are allocated to the third and fourth sub groups 552 and 554, nonvolatile memory devices included in the third and fourth sub groups 552 and 554 may be categorized as one group.

Nonvolatile memory devices included in a fourth group 570 may be categorized into one or more sub groups, such as a seventh sub group 572 and/or an eighth sub group 574, etc. Nonvolatile memory devices, such as NVM_61, NVM_62, NVM_63, and NVM_64, etc., included in the seventh sub group 572 are selected by a chip enable signal CE_6. In addition, nonvolatile memory devices, such as NVM_71, NVM_72, NVM_73, and NVM_74, etc., included in the eighth sub group 574 are selected by a chip enable signal CE_7. Even though the different chip enable signals CE_6 and CE_7 are allocated to the seventh and eighth sub groups 572 and 574, nonvolatile memory devices included in the seventh and eighth sub groups 572 and 574 may be categorized as one group.

The above-described group categorization method may be equally applied to nonvolatile memory devices of a third group Group3 not illustrated.

In data training, the storage controller 510 performs the data training on the first group 530. The storage controller 510 may perform data training on the buffer chip 520 connected by the data signal line DQ_0. That is, the data training of the first group 530 may be performed substantially through read training and/or write training for the buffer chip 520. There is no need to perform data training between the buffer chip 520 and the nonvolatile memory devices included in the first group 530, e.g., NVM_01, NVM_02, NVM_03, NVM_04, NVM_11, NVM_12, NVM_13, and NVM_14. The reason is that a difference in data skews between the buffer chip 520 and the nonvolatile memory devices of the first group 530, e.g., NVM_01, NVM_02, NVM_03, NVM_04, NVM_11, NVM_12, NVM_13, and NVM_14, is non-existent, are comparable, are negligible, and/or within a desired threshold amount.

Data training for the second group 550 may be performed the same as the data training for the first group 530. That is, the data training may be only performed on the data signal line DQ_1 between the storage controller 510 and the buffer chip 540. The storage controller 510 may perform read training and/or write training for the buffer chip 540 for data training of the second group 550. Even though different chip enable signals CE_2 and CE_3 are connected to storage media (or sub groups) 552 and 554 by an operation of the buffer chip 540, a data skew between the storage media 552 and 554 is non-existent, are comparable, are negligible, and/or within a desired threshold amount. In other words, a buffer chip may compensate for data skew (e.g., may equalize the data skew, etc.) between different groups and/or sub groups of storage media, even if the groups and/or sub groups of storage media are connected using different chip enable signals.

Data training may be performed on nonvolatile memory devices of a fourth group 570 through read training and/or write training of the buffer chip 560 and on nonvolatile memory devices of a third group not illustrated through read training and/or write training of a buffer chip not illustrated in the above-described manner.

The storage device 500 in which data training is performed in units of buffer chip is briefly described above. A plurality of nonvolatile memory devices are substantially present in the storage device 500, but data training may be performed with respect to the buffer chips, e.g., buffer chips 520, 540, and 560. Accordingly, the number of times that data training is performed depends on the number of buffer chips, e.g., buffer chips 520, 540, and 560, not the number of nonvolatile memory devices. As the data training method is applied to the storage device 500 equipped with the large number of nonvolatile memory devices depending on a demand on a high capacity, open timing may be reduced upon booting, initialization, etc., thereby making it possible to secure a fast access.

Figure 11:
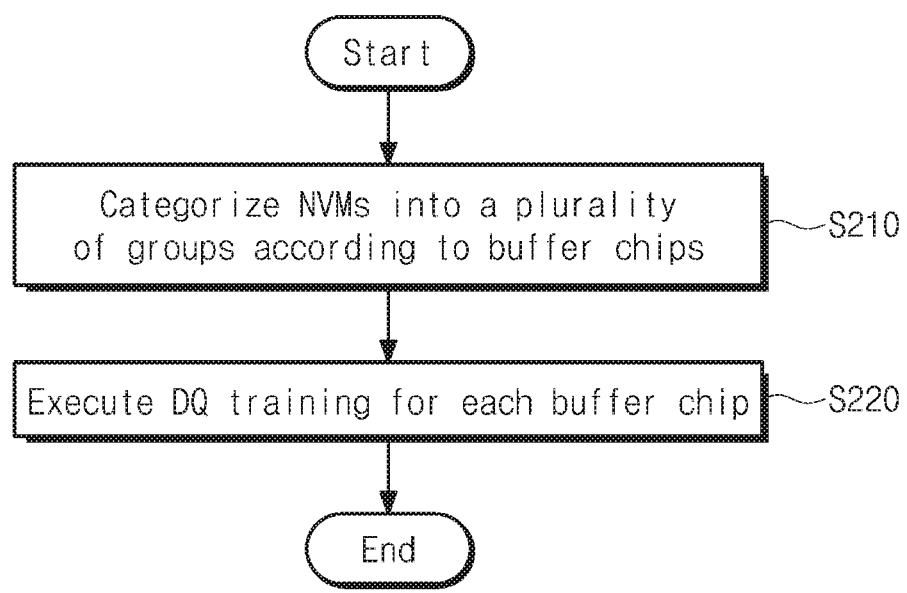
FIG. 11 is a flowchart illustrating a group-based data training method performed in the storage device of FIG. 10 according to at least one example embodiment.

FIG. 11 is a flowchart illustrating a group-based data training method performed in a storage device of FIG. 10 according to at least one example embodiment. Referring to FIG. 11, the storage device 500 (refer to FIG. 10) including a plurality of buffer chips, e.g., the buffer chips 520, 540, and/or 560, etc., and nonvolatile memory devices of the plurality of groups, e.g., 530, 550, and/or 570, etc., performs data training on each group only through data training for the buffer chips, e.g., buffer chips 520, 540, and 560.

In operation S210, the storage controller 510 may categorize a plurality of nonvolatile memory devices NVM_ij depending on a connection relationship with the buffer chips, e.g., buffer chips 520, 540, and/or 560, etc. For example, nonvolatile memory devices connected to the buffer chip 520 may be categorized as the first group 530 regardless of the chip enable signals CE_0 and CE_1. The storage controller 510 may categorize nonvolatile memory devices connected to the buffer chip 540 as the second group 550.

In operation S220, the storage controller 510 performs data training on the buffer chips, e.g., buffer chips 520, 540, and/or 560, etc. The storage controller 510 may complete data training of each group by sequentially performing read training and/or write training for the buffer chips, e.g., buffer chips 520, 540, and/or 560, etc. Data training for adjusting delays of data lines, such as DQ_01, DQ_02, DQ_11, DQ_12, . . . , DQ_31, and/or DQ_32, etc., between buffer chips and nonvolatile memory devices may not be substantially performed.

A method in which data training is performed in units of buffer chip connected in the storage device 500 having a plurality of buffer chips, e.g., the buffer chips 520, 540, and 560, is described above. Since data training is substantially performed with respect to the plurality of buffer chips, such as buffer chips 520, 540, and 560, a time taken for the data training may decrease.

According to at least one example embodiment of the inventive concepts, it may be possible to markedly reduce a time taken for data training of a nonvolatile memory device. Accordingly, it may be possible to reduce a booting time (or an open time) of a storage device.

While the inventive concepts has been described with reference to various example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A storage device comprising:
    a plurality of nonvolatile memory devices each configured to exchange data based on a data strobe signal and a data signal; and
    a storage controller configured to,
        categorize the plurality of nonvolatile memory devices into a plurality of groups, the plurality of groups including at least a first group, the first group including at least two nonvolatile memory devices of the plurality of nonvolatile memory devices,
        perform data training of the plurality of nonvolatile memory devices in units of the plurality of groups, the data training of the plurality of nonvolatile memory devices including,
            performing data training on a first nonvolatile memory device selected from the first group of the plurality of groups, and
            setting a delay period of a data signal of a second nonvolatile memory device included in the first group based on a result value of the data training for the first nonvolatile memory device.

2. The storage device of claim 1, wherein the storage controller is configured to perform the categorization of the plurality of nonvolatile memory devices by categorizing the plurality of groups based on chip enable signals for selecting the plurality of nonvolatile memory devices.

3. The storage device of claim 2, wherein
    the chip enable signals include a first chip enable signal and a second chip enable signal; and
    the storage controller is further configured to perform the categorization by categorizing nonvolatile memory devices selected by the first chip enable signal as included in the first group, and categorizing nonvolatile memory devices selected by the second chip enable signal as included in a second group of the plurality of groups.

4. The storage device of claim 1, wherein the storage controller is further configured to perform the categorization of the plurality of nonvolatile memory devices into the plurality of groups based on lengths of signal lines associated with the plurality of nonvolatile memory devices connected to the storage controller.

5. The storage device of claim 4, wherein the signal lines include data signal lines for transmitting the respective data signals.

6. The storage device of claim 1, wherein the storage controller is further configured to perform the categorization of the plurality of nonvolatile memory devices into the plurality of groups based on heights of the plurality of nonvolatile memory devices stacked on a printed circuit board.

7. The storage device of claim 1, wherein the storage controller is further configured to perform the categorization of the plurality of nonvolatile memory devices into the plurality of groups based on relative distances of the plurality of nonvolatile memory devices to the storage controller on a printed circuit board on which the plurality of nonvolatile memory devices are mounted.

8. A storage device comprising:
    a plurality of nonvolatile memory devices each configured to exchange data based on a data strobe signal and a data signal;
    a storage controller configured to access the plurality of nonvolatile memory devices;
    a plurality of buffer chips each configured to provide a data buffering function between the storage controller and the plurality of nonvolatile memory devices; and
    the storage controller is further configured to perform data training on the plurality of buffer chips and skip data training of the plurality of nonvolatile memory devices.

9. The storage device of claim 8, wherein
    the plurality of buffer chips includes a first buffer chip connected to the storage controller through first data lines; and
    the first buffer chip is connected to a first group of nonvolatile memory devices through first sub data lines, and to a second group of nonvolatile memory devices through second sub data lines.

10. The storage device of claim 9, wherein the storage controller is further configured to:
    activate the first group of nonvolatile memory devices using a first chip enable signal; and
    activate the second group of nonvolatile memory devices using a second chip enable signal.

11. A data training method of a storage device, the storage device including a storage controller and a plurality of nonvolatile memory devices, the method comprising:
    categorizing, using the storage controller, the plurality of nonvolatile memory devices into a plurality of groups based on a categorization reference, each group of the plurality of groups including at least two nonvolatile memory devices;
    selecting, using the storage controller, a representative nonvolatile memory device for at least one group of the plurality of groups;
    performing, using the storage controller, data training with respect to the representative nonvolatile memory device for the at least one group; and
    setting, using the storage controller, delay values of data signals of the non-representative nonvolatile memory devices included in the at least one group based on a data training result for the representative nonvolatile memory device corresponding to the at least one group.

12. The method of claim 11, wherein the categorization reference includes a length and a data skew of a data signal line formed between the storage controller and each nonvolatile memory device of the plurality of nonvolatile memory devices.

13. The method of claim 11, wherein the selecting the representative nonvolatile memory device includes:
   selecting the representative nonvolatile memory device from the at least two nonvolatile memory devices included in the at least one group based on an order of a chip address associated with the at least two nonvolatile memory devices.

14. The method of claim 11, further comprising:
   selecting, using the storage controller, the plurality of groups using different chip enable signals for each of the plurality of groups.

* * * * *